US012628566B2

(12) United States Patent
Herzog et al.

(10) Patent No.: US 12,628,566 B2
(45) Date of Patent: May 12, 2026

(54) MICROMECHANICAL COMPONENT, SOUND TRANSDUCER DEVICE, AND METHOD FOR PRODUCING A MICROMECHANICAL COMPONENT

(71) Applicant: Robert Bosch GmbH, Stuttgart (DE)

(72) Inventors: Florian Herzog, Reutlingen (DE); Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 814 days.

(21) Appl. No.: 18/002,314

(22) PCT Filed: Aug. 18, 2021

(86) PCT No.: PCT/EP2021/072899
§ 371 (c)(1),
(2) Date: Dec. 19, 2022

(87) PCT Pub. No.: WO2022/058114
PCT Pub. Date: Mar. 24, 2022

(65) Prior Publication Data
US 2023/0354714 A1     Nov. 2, 2023

(30) Foreign Application Priority Data

Sep. 15, 2020     (DE) ..................... 10 2020 211 538.9

(51) Int. Cl.
*H10N 39/00* (2026.01)
*B06B 1/06* (2006.01)

(52) U.S. Cl.
CPC ........... *H10N 39/00* (2023.02); *B06B 1/0666* (2013.01)

(58) Field of Classification Search
CPC .. H10N 39/00; B06B 1/0666; B81C 1/00238; B81C 2203/0792; B81B 2201/0271; B81B 2203/0127; B81B 2207/053; B81B 7/0006
See application file for complete search history.

(56) References Cited

U.S. PATENT DOCUMENTS 4,216,401 A * 8/1980 Wagner ................... B60R 13/10
                                                    73/754
4,454,440 A * 6/1984 Cullen .................. G01L 9/0025
                                                    310/346
(Continued)

FOREIGN PATENT DOCUMENTS

CN          102670259 A       9/2012
CN          102933318 A       2/2013
(Continued)

OTHER PUBLICATIONS

International Search Report for PCT/EP2021/072899, Issued Nov. 5, 2021.

*Primary Examiner* — Pedro J Cuevas
(74) *Attorney, Agent, or Firm* — NORTON ROSE FULBRIGHT US LLP

(57) ABSTRACT

A micromechanical component for a sound transducer device. The micromechanical component includes a substrate, a diaphragm, at least one piezoelectric element, and at least one electrical contact connection. The diaphragm can vibrate and is connected to the substrate. The at least one piezoelectric element is disposed between the diaphragm and the substrate and is connected to the diaphragm. The at least one piezoelectric element is designed to produce and/or detect vibrations of the diaphragm in the ultrasonic range. The at least one electrical contact connection is electrically connected to the at least one piezoelectric element. The micromechanical component can be connected, using flip (Continued)

chip technology, to a control circuit such that the at least one piezoelectric element can be electrically connected to the control circuit by means of the at least one electrical contact connection.

13 Claims, 20 Drawing Sheets

(56)                     References Cited

U.S. PATENT DOCUMENTS

| 4,766,666 | A  * | 8/1988 | Sugiyama | G01L 9/0055 |
| | | | | 29/454 |
| 6,131,466 | A  * | 10/2000 | Vigna | G01L 9/0055 |
| | | | | 73/721 |
| 6,417,021 | B1 * | 7/2002 | Vigna | G01L 9/0042 |
| | | | | 438/53 |
| 6,586,861 | B2 * | 7/2003 | Misu | H03H 9/02133 |
| | | | | 310/365 |
| 6,967,431 | B2 * | 11/2005 | Buhler | H10N 30/073 |
| | | | | 347/68 |
| 7,364,275 | B2 * | 4/2008 | Lim | B41J 2/161 |
| | | | | 29/25.35 |
| 7,427,820 | B2 * | 9/2008 | Yoshioka | H10N 30/045 |
| | | | | 257/419 |
| 7,524,024 | B2 * | 4/2009 | Murata | B41J 2/1646 |
| | | | | 347/50 |
| 8,741,774 | B2 * | 6/2014 | Reinmuth | G01L 19/0076 |
| | | | | 257/773 |
| 9,347,840 | B2 * | 5/2016 | Hurst | G01L 1/205 |
| 10,998,798 | B2 | 5/2021 | Schlitzkus et al. | |
| 12,410,053 | B1 * | 9/2025 | Bibl | G06F 3/016 |
| 12,490,033 | B2 * | 12/2025 | Yuan | H04R 17/02 |
| 2006/0209139 | A1 * | 9/2006 | Murata | B41J 2/1646 |
| | | | | 347/71 |
| 2007/0063206 | A1 * | 3/2007 | Maeda | H05K 3/361 |
| | | | | 257/88 |
| 2008/0111453 | A1 * | 5/2008 | Yoshioka | H10N 30/2047 |
| | | | | 310/324 |
| 2008/0130921 | A1 * | 6/2008 | Tokuhisa | H04R 1/08 |
| | | | | 381/190 |
| 2008/0212407 | A1 | 9/2008 | Caliano et al. | |
| 2009/0108382 | A1 * | 4/2009 | Eriksen | C23C 14/0682 |
| | | | | 257/419 |
| 2013/0099382 | A1 * | 4/2013 | Reinmuth | G01L 9/0045 |
| | | | | 257/770 |
| 2015/0020610 | A1 * | 1/2015 | Hurst | G01L 1/2287 |
| | | | | 73/862.68 |
| 2017/0153158 | A1 | 6/2017 | Fan | |
| 2017/0320093 | A1 | 11/2017 | Chatterjee et al. | |
| 2019/0290243 | A1 | 9/2019 | Bryzek et al. | |
| 2023/0142881 | A1 * | 5/2023 | Rinaldi | H10N 30/87 |
| | | | | 310/328 |
| 2023/0217163 | A1 * | 7/2023 | Zhou | H04R 17/02 |
| | | | | 381/380 |
| 2023/0247352 | A1 * | 8/2023 | Yuan | H04R 17/025 |
| | | | | 381/151 |
| 2023/0391610 | A1 * | 12/2023 | Huang | B81B 7/0061 |
| 2025/0135773 | A1 * | 5/2025 | Aoyama | B41J 2/161 |

FOREIGN PATENT DOCUMENTS

| CN | 106388856 | A | | 2/2017 | |
| CN | 108367314 | A | | 8/2018 | |
| CN | 111084637 | A | | 5/2020 | |
| DE | 102015216454 | A1 | | 3/2017 | |
| DE | 102020211537 | A1 | * | 3/2022 | B06B 1/0622 |
| EP | 3656478 | A1 | * | 5/2020 | B81C 1/00825 |
| GB | 2037987 | A | * | 7/1980 | B60R 13/10 |
| JP | 2008017433 | A | * | 1/2008 | H04R 1/08 |
| JP | 2009240083 | A | | 10/2009 | |
| JP | 2014057431 | A | | 3/2014 | |
| JP | 2016039701 | A | | 3/2016 | |
| JP | 2017095041 | A | | 6/2017 | |
| JP | 2018072086 | A | | 5/2018 | |
| WO | 2016106153 | A1 | | 6/2016 | |

* cited by examiner

Fig. 1
RELATED ART

MICROMECHANICAL COMPONENT, SOUND TRANSDUCER DEVICE, AND METHOD FOR PRODUCING A MICROMECHANICAL COMPONENT

FIELD

The present invention relates to a micromechanical component for a sound transducer device, to a sound transducer device and to a method for producing a micromechanical component for a sound transducer device. The micromechanical component may also be designed for use as a spatially resolved material detector, as an optical mirror, or as an interferometer.

BACKGROUND INFORMATION

Ultrasonic transducers may be designed as micro-electro-mechanical systems (MEMS). Such devices that emit and detect ultrasonic waves by means of the piezoelectric effect are referred to as piezoelectric micromachined ultrasonic transducers (PMUTs). An exemplary PMUT with low stress sensitivity is described in International Patent Application No. WO 2016/106153 A1.

PMUTs are characterized by a compact structure and a high resolution. Piezoelectric elements produce vibrations of diaphragms and surrounding liquids, whereby ultrasonic waves are emitted. Reflected ultrasonic waves are detected by means of the piezoelectric elements. Due to the semiconductor production processes, many individual PMUTs can be combined into an array on one chip particularly easily and inexpensively. By using an array of such PMUTs, the environment can thereby be mapped. MEMS PMUTs are therefore particularly suitable for imaging methods, for example in medical technology.

An exemplary structure of an ultrasonic head 7 is illustrated in FIG. 1, wherein an array comprising a plurality of PMUT cells 3 is formed. By means of a piezoelectric layer 2, a thin diaphragm 1 is excited to vibrations, which are transferred to a gel 8. Each individual PMUT cell 3 is supplied with an electrical signal, which is delivered by a control chip or application-specific integrated circuit (ASIC) chip 5.

In a traditional approach, two chips 4, 5 are typically combined. On a first MEMS chip 4, the array with the PMUT cells 3 is provided. A second ASIC chip 5 is placed next to the MEMS chip 4 on a common substrate.

The many electrical connections between the MEMS chip 4 and the ASIC chip 5 are produced by bonding wires 6, which are each placed at the edges of the two chips 4, 5.

In this arrangement, in an array, the electrical connections by means of bonding wires 6 can take place only at the edge of the MEMS chip 4. The length of the edge of the MEMS chip 4 scales with the diameter of the MEMS chip 4, while the number of possible PMUTs 3 on the MEMS chip 4 scales with the surface area thereof, i.e., the square of the diameter. This makes contacting the MEMS chip 4 difficult, especially for large arrays.

Furthermore, for the traditional wire bonding technique, the ASIC chip 5 must be arranged next to the MEMS chip 4 if possible. Due to the parallel arrangement of the two chips 4, 5, the ultrasonic head 7 becomes larger than would be necessary for technical reasons.

In addition, the bonding wires 6 must be protected while the ultrasonic signal of the PMUTs 3 should be transmitted as undisturbed as possible. This requires a complex structure. A defined gelling process, wherein a gel 8 is applied to the diaphragm 1, is difficult with such an arrangement.

In an alternative approach illustrated in FIG. 2, MEMS PMUTs 3 are produced by means of additional steps on a finished ASIC wafer above the ASIC chip. By means of suitable measures, a direct electrical connection is produced between the ASIC chip and the PMUTs 3. Thus, very large PMUT arrays can be produced on the one hand and more favorable, smaller design concepts can be achieved on the other hand.

This concept results in limitations in the production process of the PMUT cells 3 if the latter are to be arranged on an ASIC chip. For example, typical ASIC wafers may not be heated above 400° C. for an extended period. This makes it difficult to produce inexpensive and performant PMUTs. In particular, piezoelectric layers with high piezo coefficients are difficult to produce.

Furthermore, the ASIC production process must be adjusted if electrical contacts are to be produced between the PMUTs and the ASICs. This reduces the flexibility of the system. If a new ASIC process that provides advantages comes onto the market, the process must first be adjusted before the process can be used.

Furthermore, the ASIC chip and the MEMS chip must be the same size. If one of the chips is larger by default, the size of the smaller type must be adjusted accordingly, whereby additional costs are incurred.

SUMMARY

The present invention provides a micromechanical component for a sound transducer device, a sound transducer device, and a method for producing a micromechanical component for a sound transducer device.

Preferred embodiments of the present invention are disclosed herein.

According to a first aspect, the present invention accordingly relates to a micromechanical component for a sound transducer device. According to an example embodiment of the present invention, the micromechanical component comprises a substrate, a diaphragm, at least one piezoelectric element, and at least one electrical contact connection. The diaphragm can vibrate and is connected to the substrate. The at least one piezoelectric element is arranged between the diaphragm and the substrate and is connected to the diaphragm. The at least one piezoelectric element is designed to produce and/or detect vibrations of the diaphragm in the ultrasonic range. The at least one electrical contact connection is electrically connected to the at least one piezoelectric element. The micromechanical component can be connected, using flip chip technology, to a control circuit such that the at least one piezoelectric element can be electrically connected to the control circuit by means of the at least one electrical contact connection. The term "can be connected" is to be understood to mean that there is at least one state in which the piezoelectric element is connected to the control circuit by means of the electrical contact connection.

According to a second aspect, the present invention accordingly relates to a sound transducer device comprising a micromechanical component according to the present invention. Furthermore, according to an example embodiment of the present invention, the sound transducer device comprises a control circuit. The micromechanical component is connected, using flip chip technology, to the control circuit. The at least one piezoelectric element of the micromechanical component is electrically connected to the control circuit by means of the at least one electrical contact connection.

According to a third aspect, the present invention relates to a method for producing a micromechanical component. According to an example embodiment of the present invention, a substrate is provided. A vibrating diaphragm connected to the substrate is formed. At least one piezoelectric element is provided, which is arranged between the diaphragm and the substrate and is connected to the diaphragm. The at least one piezoelectric element is designed to produce and/or detect vibrations of the diaphragm in the ultrasonic range. At least one electrical contact connection is formed, which is electrically connected to the at least one piezoelectric element. The micromechanical component can be connected, using flip chip technology, to a control circuit such that the at least one piezoelectric element can be electrically connected to the control circuit by means of the at least one electrical contact connection. The term "can be connected" is to be understood to mean that there is at least one state in which the piezoelectric element is connected to the control circuit by means of the electrical contact connection.

According to the present invention, piezoelectric elements, i.e., PMUT elements, are coupled by means of an electrical contact connection to a control circuit mounted by means of flip chip technology. This eliminates the need for separate bonding wires for contacting the piezoelectric elements. As a result, the contacting is particularly simple and inexpensive to carry out.

By using flip chip technology, the number of possible electrical connections between the piezoelectric elements and the control circuit scales with the square of the diameter. As a result, the number of piezoelectric elements (PMUTs) in the array can in principle be selected as desired.

The electrical contact connections can easily and reliably be protected by the arrangement underneath the piezoelectric elements.

The piezoelectric elements are also particularly well protected by the arrangement on the rear side of the diaphragm (i.e., the side of the diaphragm facing the substrate).

Furthermore, according to an example embodiment of the present invention, the micromechanical component can have a simple structure since no bonding wires between the piezoelectric elements and the control circuit lie open and must be protected in the structure.

The vertical, stacked arrangement of the micromechanical component with the control circuit makes a laterally particularly small structure possible.

The micromechanical component may also be designed for use as a spatially resolved material detector, as an optical mirror, or as an interferometer.

The production of the sound transducer device by flip chip assembly is also particularly simple and inexpensive to perform.

Furthermore, the production processes for the micromechanical component and the control circuit are completely decoupled from one another in terms of both the size of the individual elements and the process control. This allows, for example, the production of piezoelectric elements at particularly high temperature, whereby piezoelectric elements with particularly high piezo coefficient can be produced.

The term "control circuit" may be understood to mean an electric circuit designed to control the at least one piezoelectric element in order to thereby induce vibrations of the diaphragm. Additionally or alternatively, the term "control circuit" may also be understood to mean an electric circuit that is controlled by the at least one piezoelectric element, i.e., receives a measurement signal. The at least one piezoelectric element converts vibrations of the diaphragm into electrical measurement signals and transmits them to the control circuit by means of the at least one electrical contact connection. The control circuit acts as an evaluation circuit, i.e., can evaluate the received measurement signal. For example, when using an array of piezoelectric elements, an environment may be mapped based on the received measurement signals of the plurality of piezoelectric elements.

The term "electrical contact connection" is to be understood to mean a connection by means of which electrical signals can be sent, such as control signals sent from the control circuit to the at least one piezoelectric element or measurement signals sent from the at least one piezoelectric element to the control circuit.

According to a preferred development of the micromechanical component of the present invention, the control circuit is an ASIC chip. The ASIC chip may comprise memory as well as computing devices, for example microprocessors, and may be designed to further evaluate measurement signals received from the at least one piezoelectric element. The ASIC chip may also control the at least one piezoelectric element by corresponding control signals in order to excite the diaphragm to vibrate.

According to a preferred development of the micromechanical component according to the present invention, the at least one electrical contact connection comprises a via (through-silicon via, TSV), which extends through the substrate.

According to a preferred development of the micromechanical component of the present invention, the substrate is connected to the diaphragm and/or the at least one piezoelectric element by means of a bonded connection. The diaphragm and substrate can thereby first be produced independently from one another and subsequently be connected by means of a bonding process.

According to a preferred development of the micromechanical component of the present invention, the bonded connection comprises at least one of aluminum and germanium.

According to a preferred development of the micromechanical component of the present invention, a circumferential insulation trench is formed in the substrate around at least one bonded connection. The bonded connection, which is part of the electrical contact connection connecting the at least one piezoelectric element to the control circuit, is thereby electrically insulated.

According to a preferred development of the micromechanical component of the present invention, an electrically insulating material is formed on a surface of the substrate in the region of the insulation trench. This improves the electrical insulation.

According to a preferred development of the micromechanical component of the present invention, the at least one electrical contact connection comprises at least one solder ball. In particular, a separate electrical contact connection with a respective solder ball may be provided for each piezoelectric element. By means of each solder ball, the control circuit may thus contact exactly one piezoelectric element.

According to a preferred development of the micromechanical component of the present invention, the at least one electrical contact connection additionally or alternatively comprises at least one first conductive path on a side of the substrate facing away from the diaphragm.

According to a preferred development of the micromechanical component of the present invention, at least one piezoelectric element of the at least one piezoelectric element is electrically connected to at least one bonded connection by means of a second conductive path. In particular, each piezoelectric element may be electrically connected to at least one bonded connection by means of a second conductive path.

According to a preferred development of the micromechanical component of the present invention, the electrical contact connection runs from a piezoelectric element through the second conductive path to the bonded connection, which represents a via, and further through the first conductive path to the solder ball.

According to a preferred development of the micromechanical component of the present invention, a material of the second conductive path comprises aluminum.

According to a preferred development of the micromechanical component of the present invention, the at least one piezoelectric element is surrounded by a completely circumferential bond frame. The bond frame connects the substrate to the diaphragm. This protects the piezoelectric elements from environmental influences.

According to a preferred development of the micromechanical component of the present invention, the substrate is a doped silicon substrate.

According to a preferred development of the micromechanical component of the present invention, the diaphragm consists at least in part of silicon. A thickness of the diaphragm is preferably less than 30 micrometers. The diaphragm can be thicker in sub-regions or can be equipped with one or more additional layers in sub-regions. Preferably, the diaphragm layer is completely closed.

According to a preferred development of the micromechanical component of the present invention, recesses are provided in the substrate on a side facing the diaphragm.

According to a preferred development of the method for producing the micromechanical component of the present invention, an etch stop layer is formed on a surface of a carrier substrate in order to form the vibrating diaphragm connected to the substrate. A diaphragm layer is furthermore formed on the etch stop layer. The carrier substrate is at least partially removed, wherein the removal takes place at least in part using etching methods. A thin and homogeneous diaphragm can thereby be produced.

According to a preferred development of the method for producing the micromechanical component of the present invention, the carrier substrate and the etch stop layer are only partially removed. The carrier substrate and the etch stop layer are structured in an edge region. A subsequent gelling process may, for example, be simplified thereby.

According to a preferred development of the method for producing the micromechanical component of the present invention, the diaphragm is connected to the substrate by means of a bonded connection.

According to a preferred development of the method for producing the micromechanical component of the present invention, a layer comprising aluminum is used for the bonding method on the diaphragm side. A layer comprising germanium is used on the substrate side.

According to a preferred development of the method for producing the micromechanical component of the present invention, a circumferential insulation trench is formed in the substrate around at least one bonded connection.

According to a preferred development of the method for producing the micromechanical component of the present invention, an electrically insulating material is formed on a surface of the substrate in the region of the insulation trench.

The present invention furthermore relates to a method for producing a sound transducer device. For this purpose, the micromechanical component produced according to the method described above is connected, using flip chip technology, to the control circuit so that the at least one piezoelectric element of the micromechanical component is electrically connected to the control circuit by means of the at least one electrical contact connection.

BRIEF DESCRIPTION OF THE DRAWINGS

Figure 1:
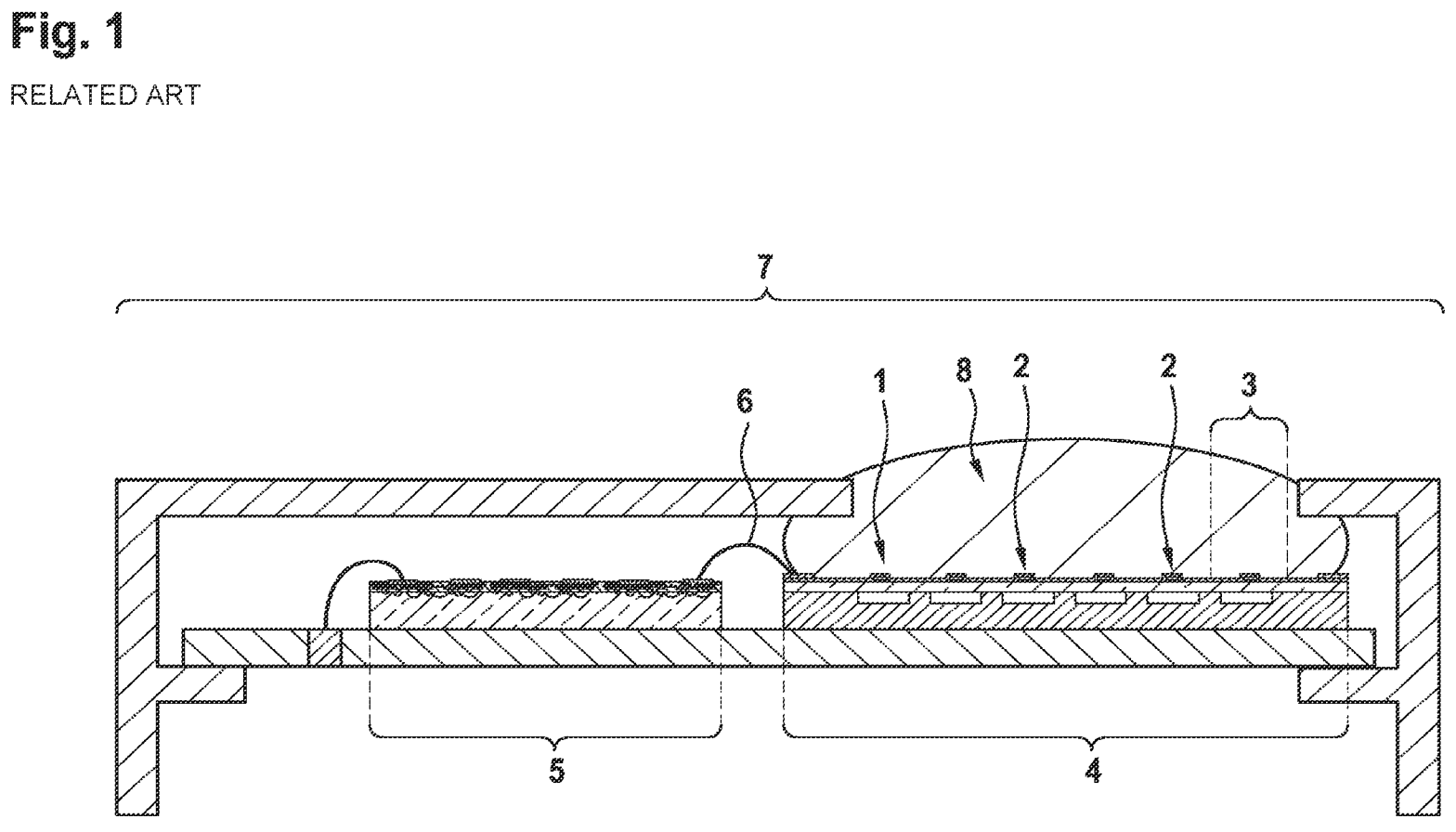

FIG. 1 shows a sound transducer device according to the related art.

In all figures, identical or functionally identical elements and devices are provided with the same reference signs. The numbering of method steps is used for reasons of clarity and is generally not intended to imply any particular temporal order. In particular, several method steps may also be carried out simultaneously.

DETAILED DESCRIPTION OF EXAMPLE EMBODIMENTS

Figure 2:
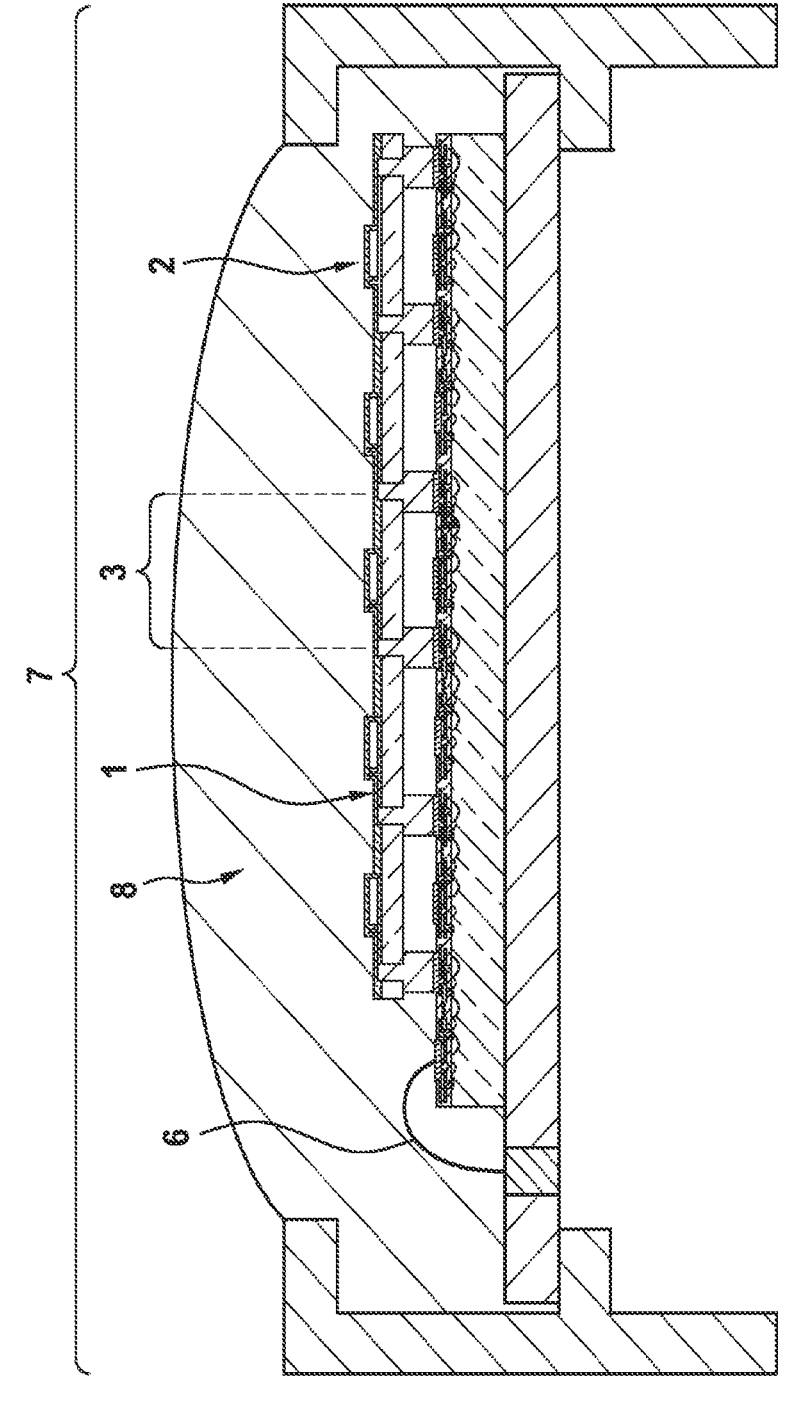
FIG. 2 shows a further sound transducer device according to the related art.
Figure 3:
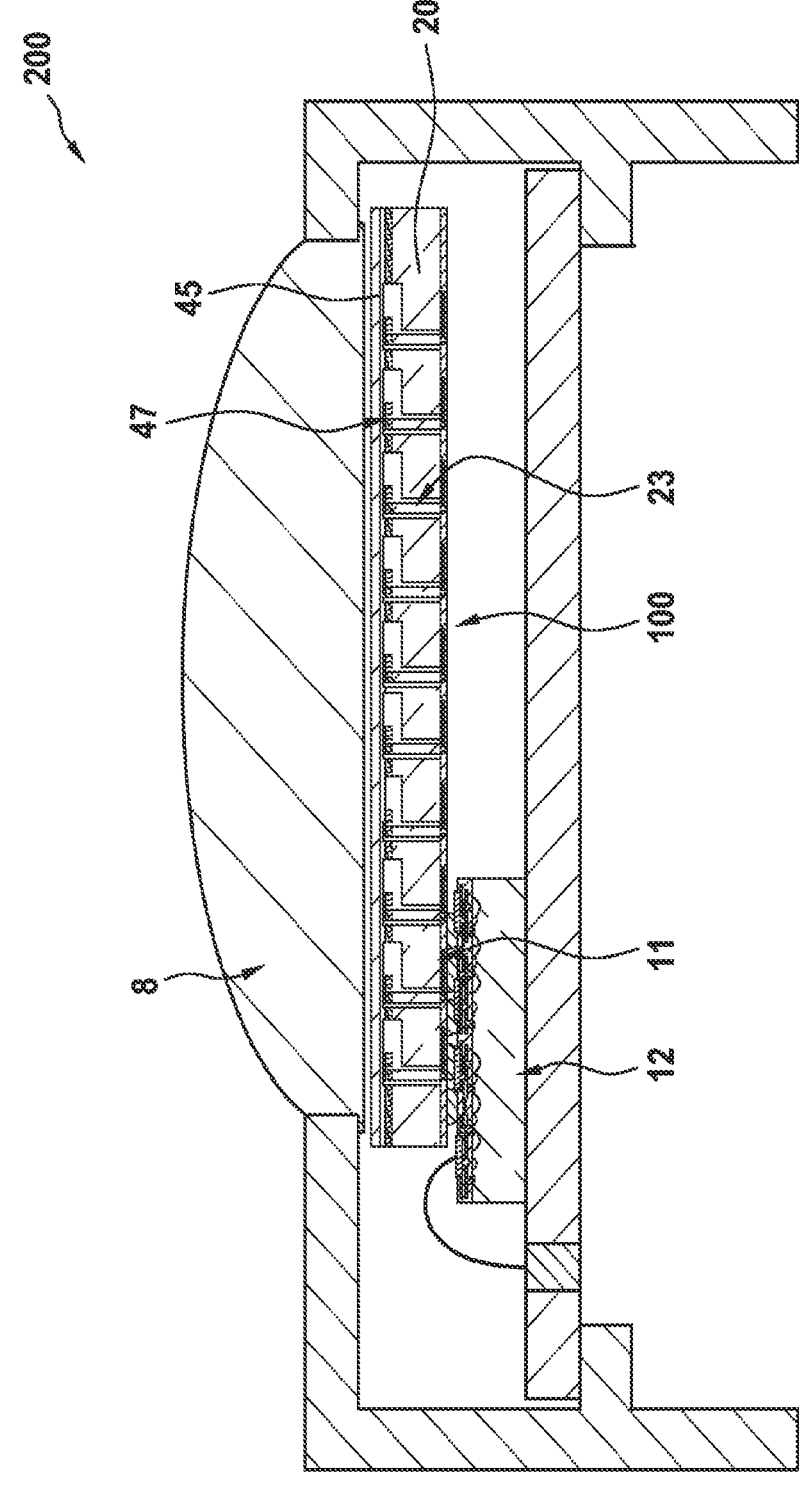
FIG. 3 shows a sound transducer device according to one embodiment of the present invention.

FIG. 3 shows a sound transducer device 200 comprising a micromechanical component 100. The micromechanical component 100 comprises a substrate 20, which is preferably formed from doped silicon, as well as a vibrating diaphragm 45 connected to the substrate 20.

The diaphragm 45 preferably consists of silicon and is preferably thinner than 30 micrometers. The diaphragm 45 can be thicker in sub-regions or can be equipped with one or more additional layers in sub-regions. Preferably, the diaphragm 45 is completely closed.

A gel 8 is formed above the diaphragm 45. Piezoelectric elements 47 are arranged between the diaphragm 45 and the substrate 20 and are connected to the diaphragm 45. The piezoelectric elements 47 form an array and are designed to produce and/or detect vibrations of the diaphragm 45 in the ultrasonic range. In the substrate 20, vias 23 are provided, which are connected to the piezoelectric elements 47.

In a connection region 11, the micromechanical component 100 is connected by means of a flip chip method to an ASIC chip 12, which functions as a control circuit. By means of the vias 23, the control circuit 12 can control the piezoelectric elements 47 and can receive measurement signals from the piezoelectric elements 47.

Figure 4:
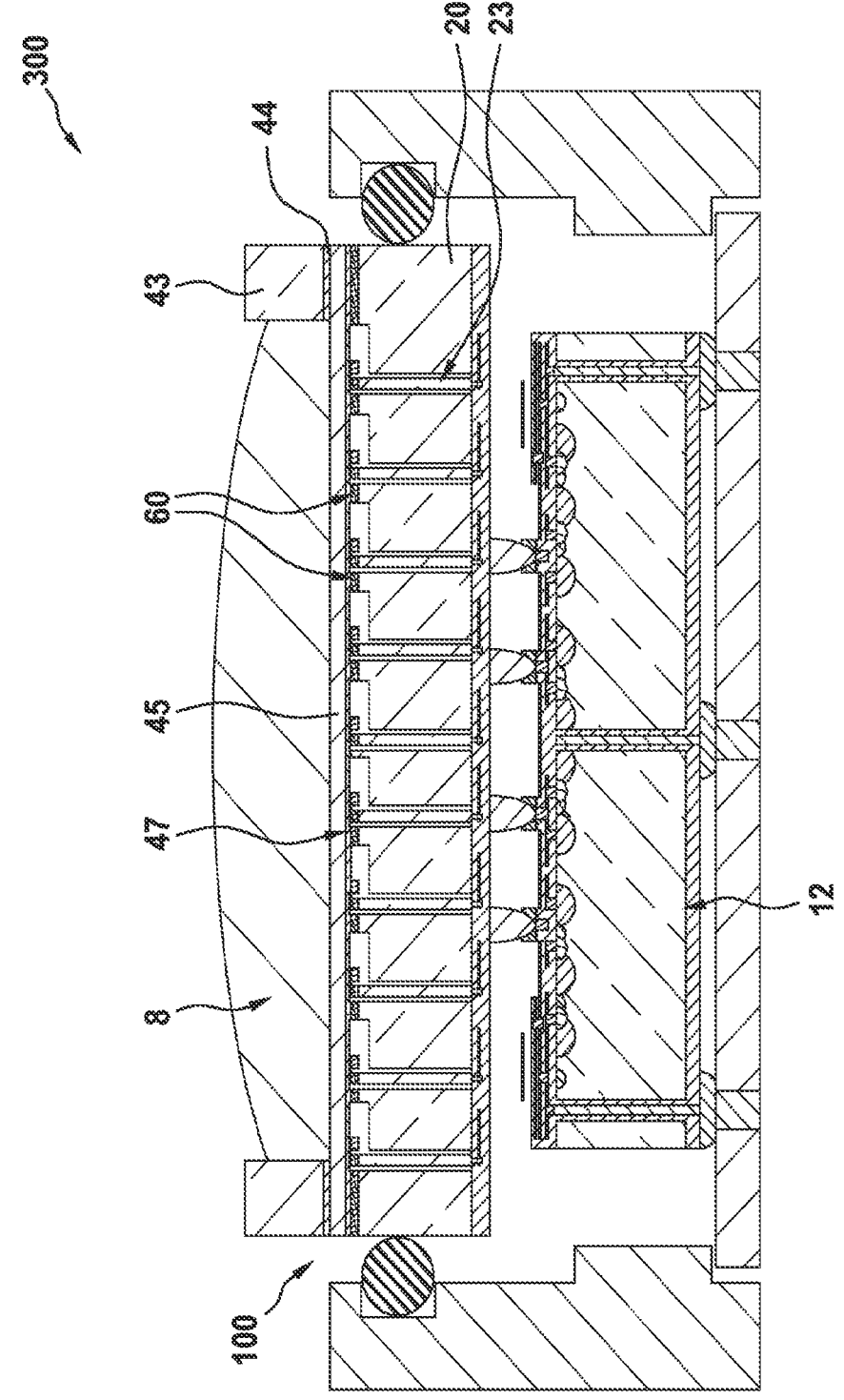
FIG. 4 shows a sound transducer device according to a further embodiment of the present invention.

FIG. 4 shows a further sound transducer device 300. In this case, a carrier substrate 43 and an etch stop layer 44 are structured in or toward an edge region so that the gel 8 is enclosed from the lateral edge. The suspension of the diaphragm 45 takes place by bond regions 60.

In FIGS. 5 to 21, method steps of a production method for producing a micromechanical component 100 are illustrated.

Figure 5:
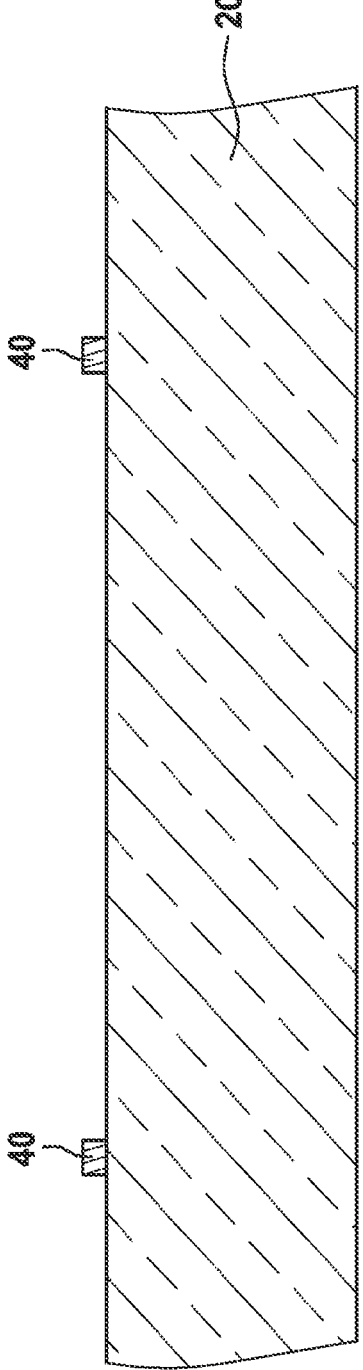
FIGS. 5-19 show schematic illustrations of intermediate products in a method for producing a micromechanical component according to an embodiment of the present invention.

As shown in FIG. 5, a substrate 20, preferably of doped silicon, is provided first. Optionally, a spacer layer 40 is applied to a first side (front side) of the substrate 20 and structured.

Figure 6:
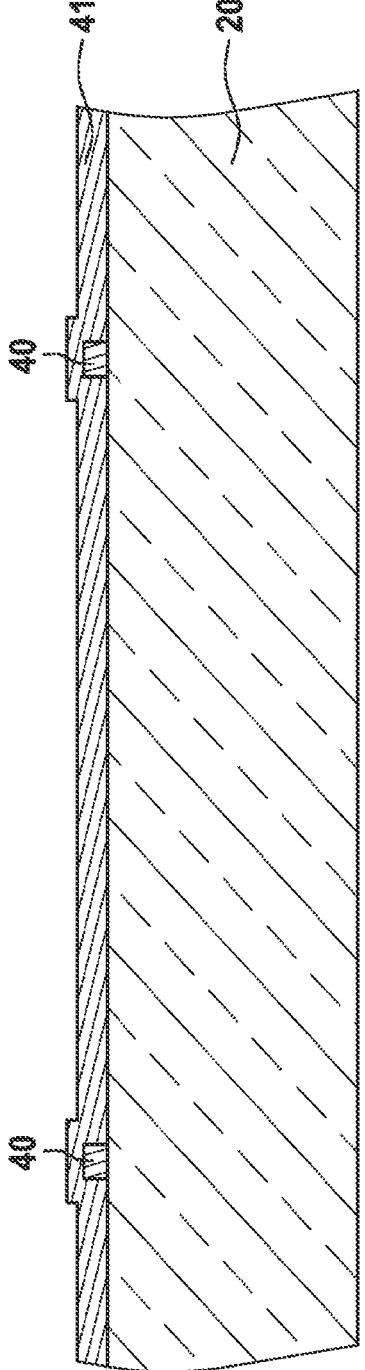

As shown in FIG. 6, a first component 41 of a bond layer is applied to the first side of the substrate 20 and structured. The first component 41 of the bond layer preferably consists at least in part of germanium.

Figure 7:
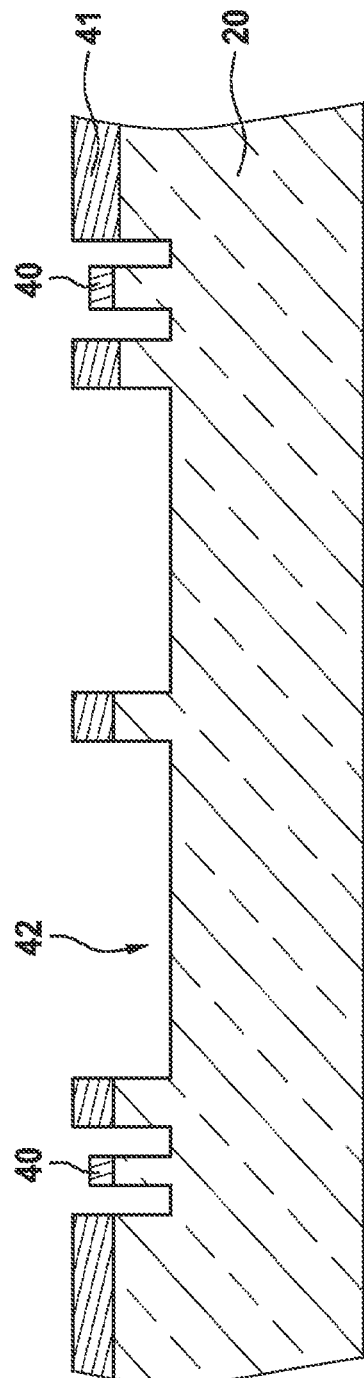

As shown in FIG. 7, a cavern 42 is optionally etched into the first side of the substrate 20. The etching of the cavern 42 may preferably and particularly inexpensively take place together with the etching of the first component 41 of the bond layer.

Figure 8:
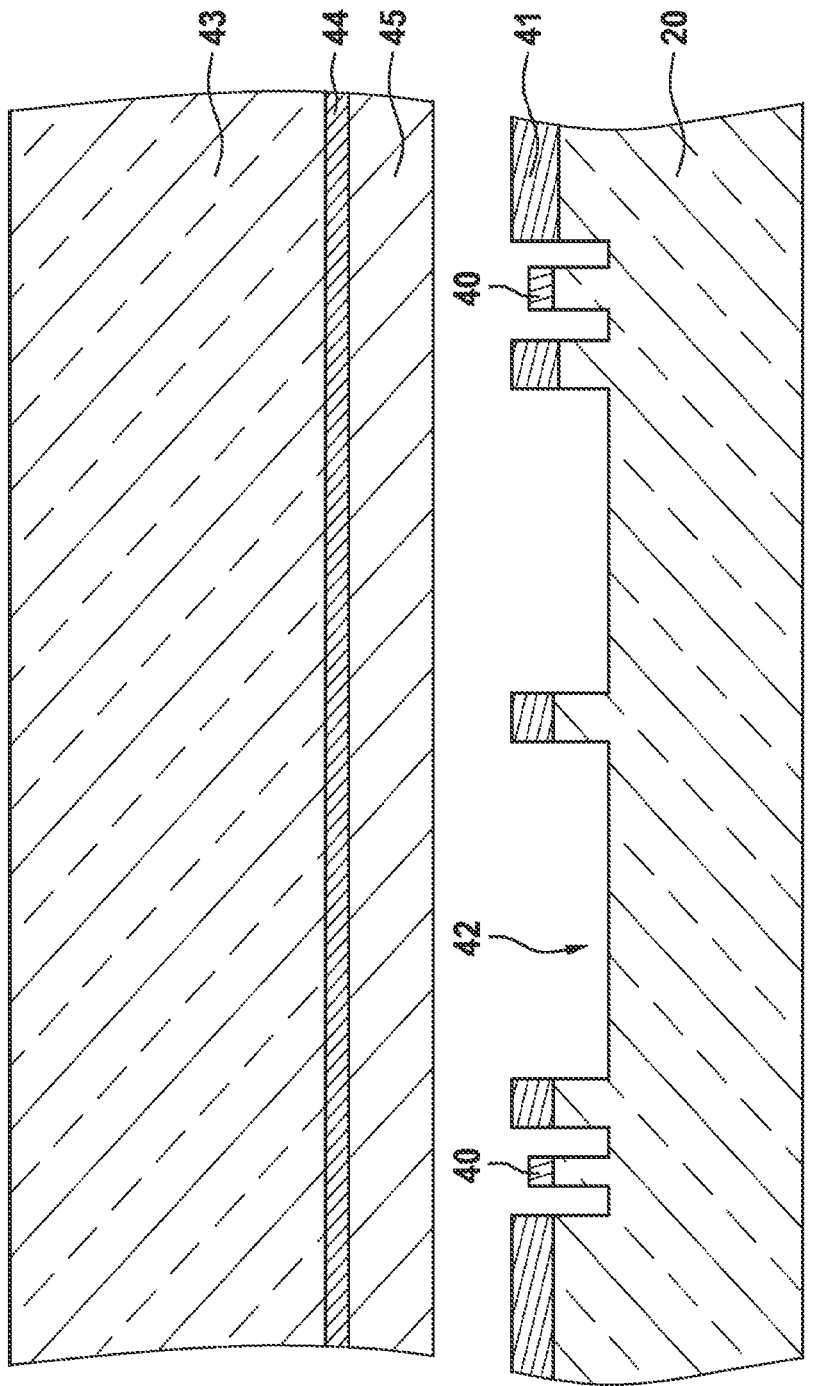

As shown in FIG. 8, on a first side of a carrier substrate 43 (i.e., a second substrate) which faces the substrate 20 in the finished state, an etch stop layer 44 and a diaphragm layer 45 are formed. The carrier substrate 43 and the etch stop layer 44 are optional here. However, a very thin and homogeneous diaphragm 45 can be produced by the use of carrier substrate 43 and etch stop layer 44.

At least one of an oxide layer, a nitride layer, and an oxide nitride layer may be used as etch stop layer 44.

The diaphragm layer 45 may preferably consist of silicon. The diaphragm layer 45 is preferably between 1.5 and 30 micrometers thick.

Figure 9:
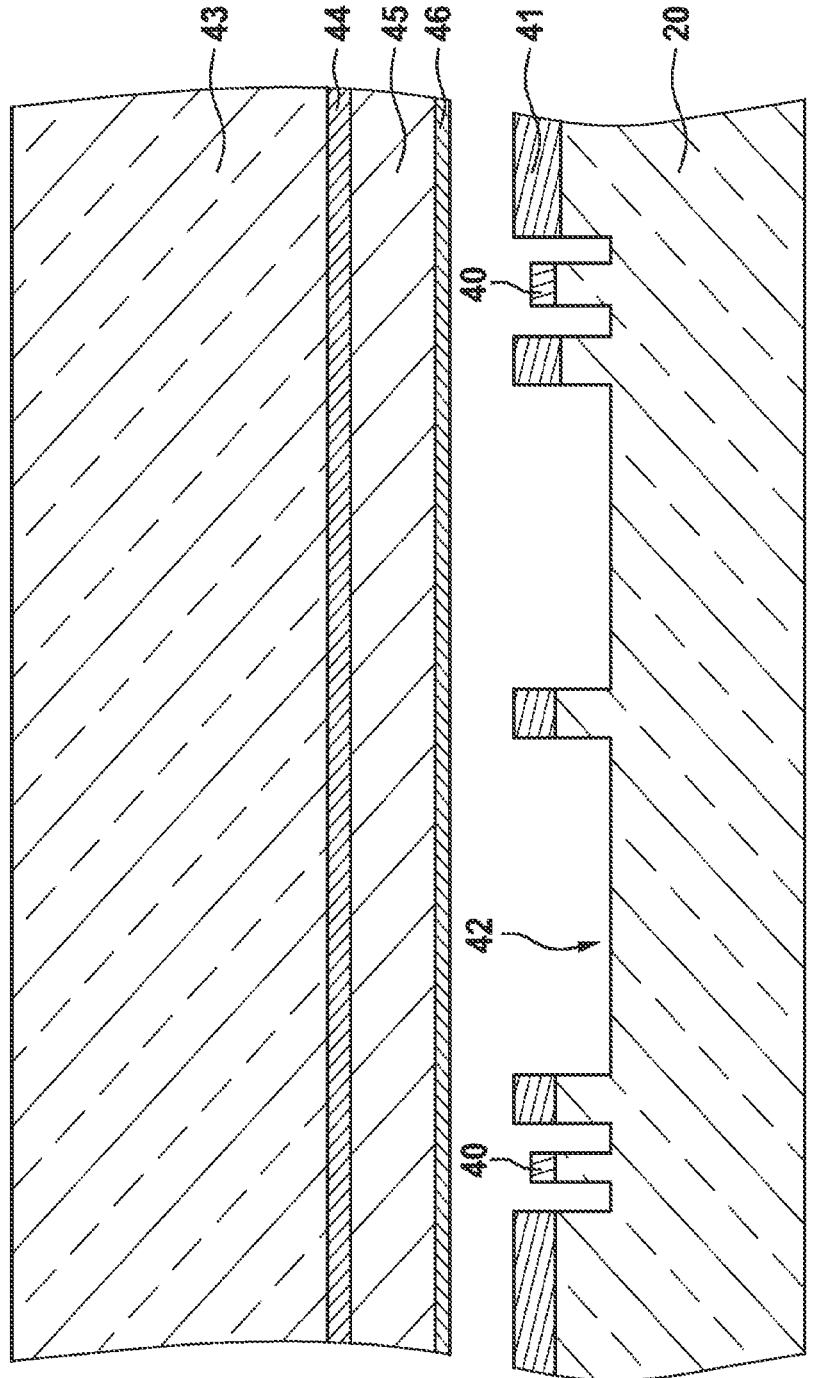

As shown in FIG. 9, an insulation layer 46 is applied to a side (rear side) of the diaphragm layer 45 which faces the substrate 20 in the finished state.

Figure 10:
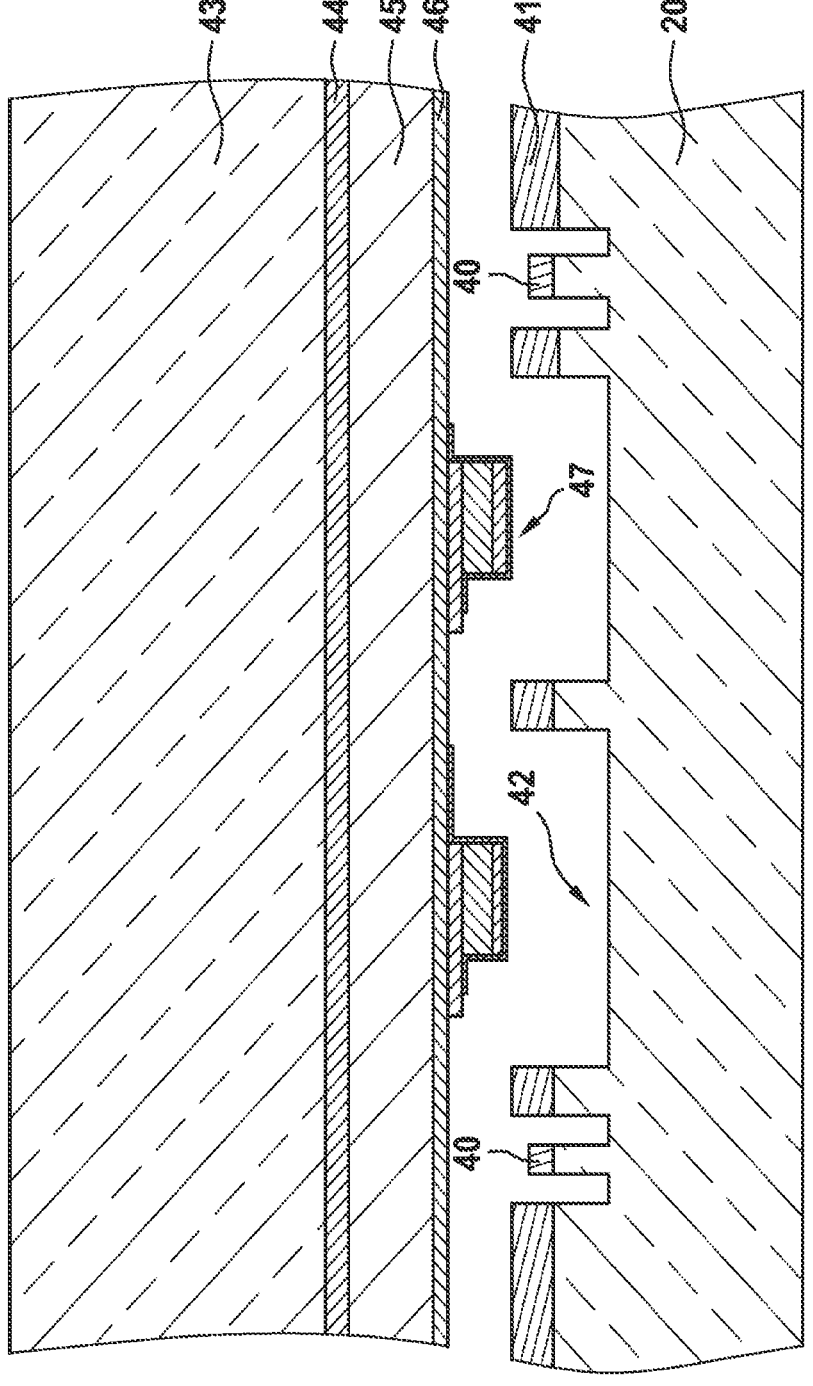

As shown in FIG. 10, piezoelectric elements 47 are applied to the insulation layer 46. The present invention is not limited to a particular number of piezoelectric elements 47. Preferably, a plurality of piezoelectric elements 47 arranged in the shape of an array are applied.

The piezoelectric elements 47 each consist of a lower electrode, the actual piezo material, and an upper electrode. Preferably, the piezo material comprises lead zirconate titanate (PZT) and/or potassium sodium niobate (KNN).

Optionally, a further layer (for example $LaNiO_3$) may be used between the lower electrode and the PZT layer for better growth.

Optionally, the piezoelectric element 47 can be encapsulated with a protective layer for protection from environmental influences. Preferably, tantalum nitride and/or silicon nitride and/or alumina is used for the protective layer.

Figure 11:
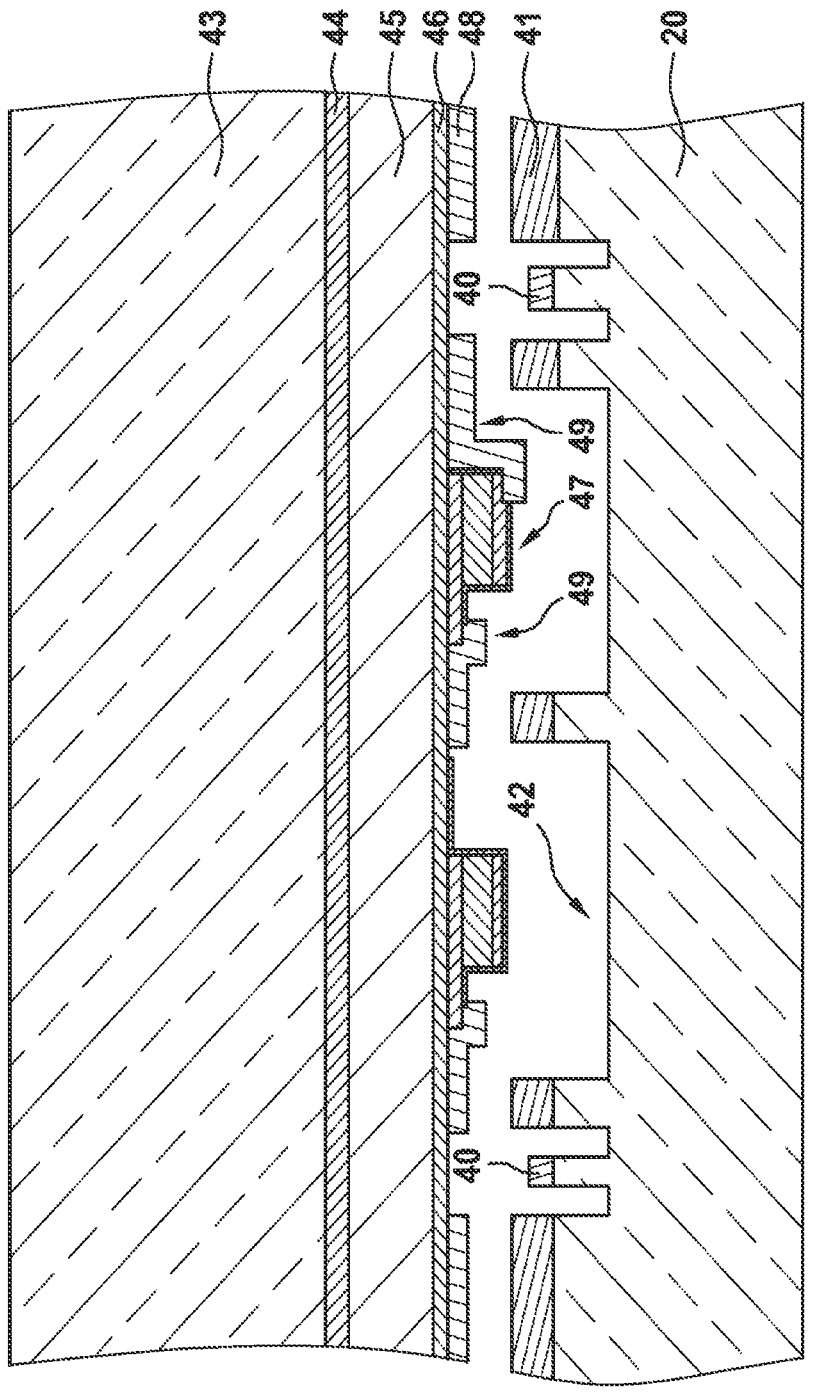

As shown in FIG. 11, a second component 48 of a bond layer is applied to the insulation layer 46 and structured. Preferably, the material of the second component 48 of the bond layer comprises aluminum.

Furthermore, a conductive path (conductive layer) 49 is applied to the insulation layer 46 and structured. With this conductive path 49, an electrical connection is produced between individual bonding surfaces described below and the electrodes of the piezoelectric elements 47.

Preferably, the material of the conductive layer 49 comprises aluminum. Preferably, the same layer is used as the second component 48 of the bond layer and as the conductive path 49 between the bonding surfaces and the electrodes.

Figure 12:
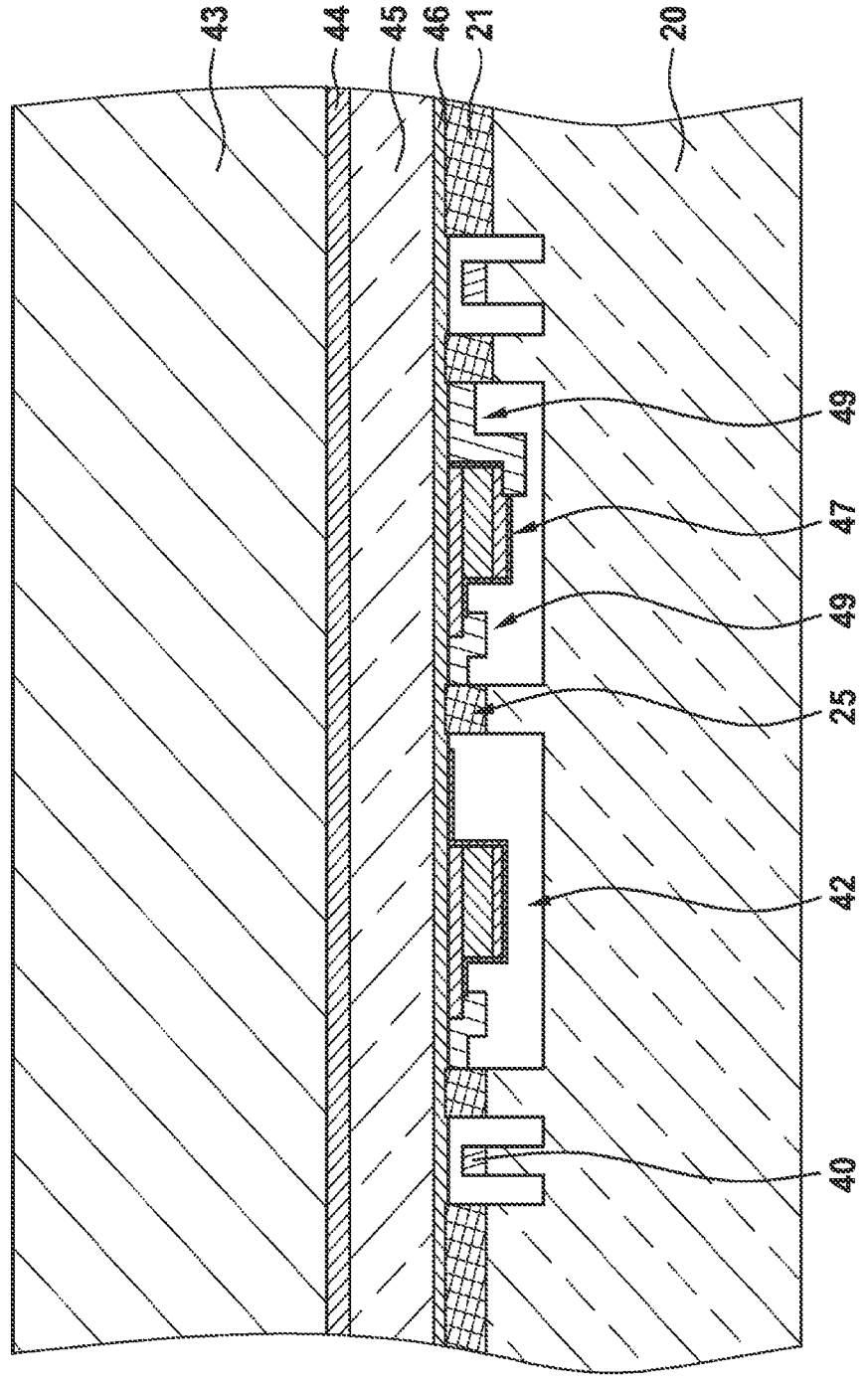

As illustrated in FIG. 12, the carrier substrate 43 with the layers located thereon is bonded to the substrate 20 with the layers located thereon. This produces bonded connections (bonding surfaces) 21 between the substrate 20 and the diaphragm 45 or bonded connections (bonding surfaces) 25 between the substrate 20 and the piezoelectric elements 47. The bonded connections 21 between the substrate 20 and the diaphragm 45 form a bond frame, which preferably completely surrounds and thereby protects the piezoelectric elements 47.

Preferably, an eutectic bonding method is used. In particular, an aluminum-germanium-containing bonding method is preferably used.

Preferably, a bonding method is used, which has a maximum temperature of 400 to 470° C.

Optionally, the substrate 20 is thinned from the second side (rear side). For this purpose, the substrate 20 is particularly preferably thinned to a thickness of 20 to 450 micrometers.

Figure 13:
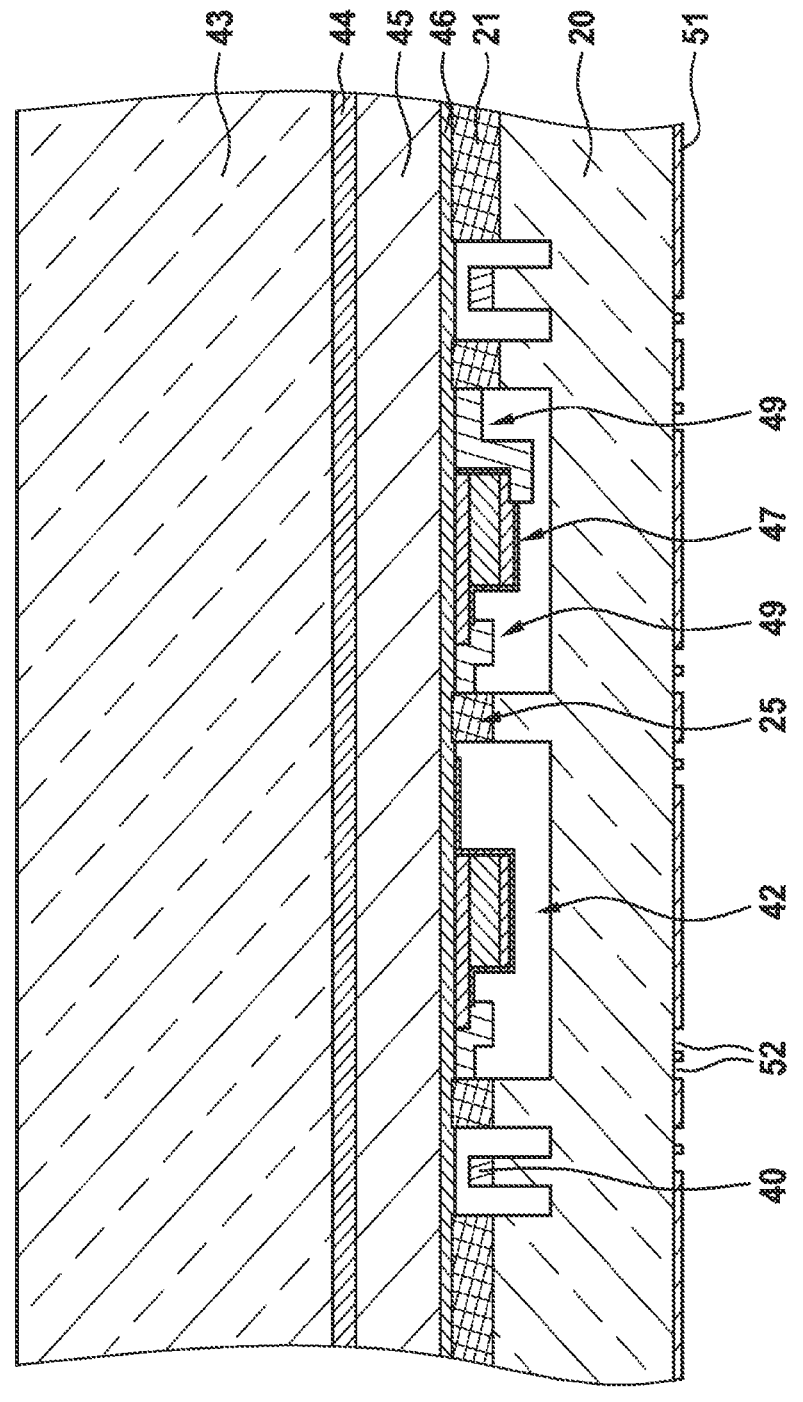

As illustrated in FIG. 13, for substrate thicknesses of between 40 and 450 micrometers, an at least partially insulating auxiliary layer 51 is preferably applied and has very narrow access holes 52 or slits in a region extending around individual bonded connections.

Figure 14:
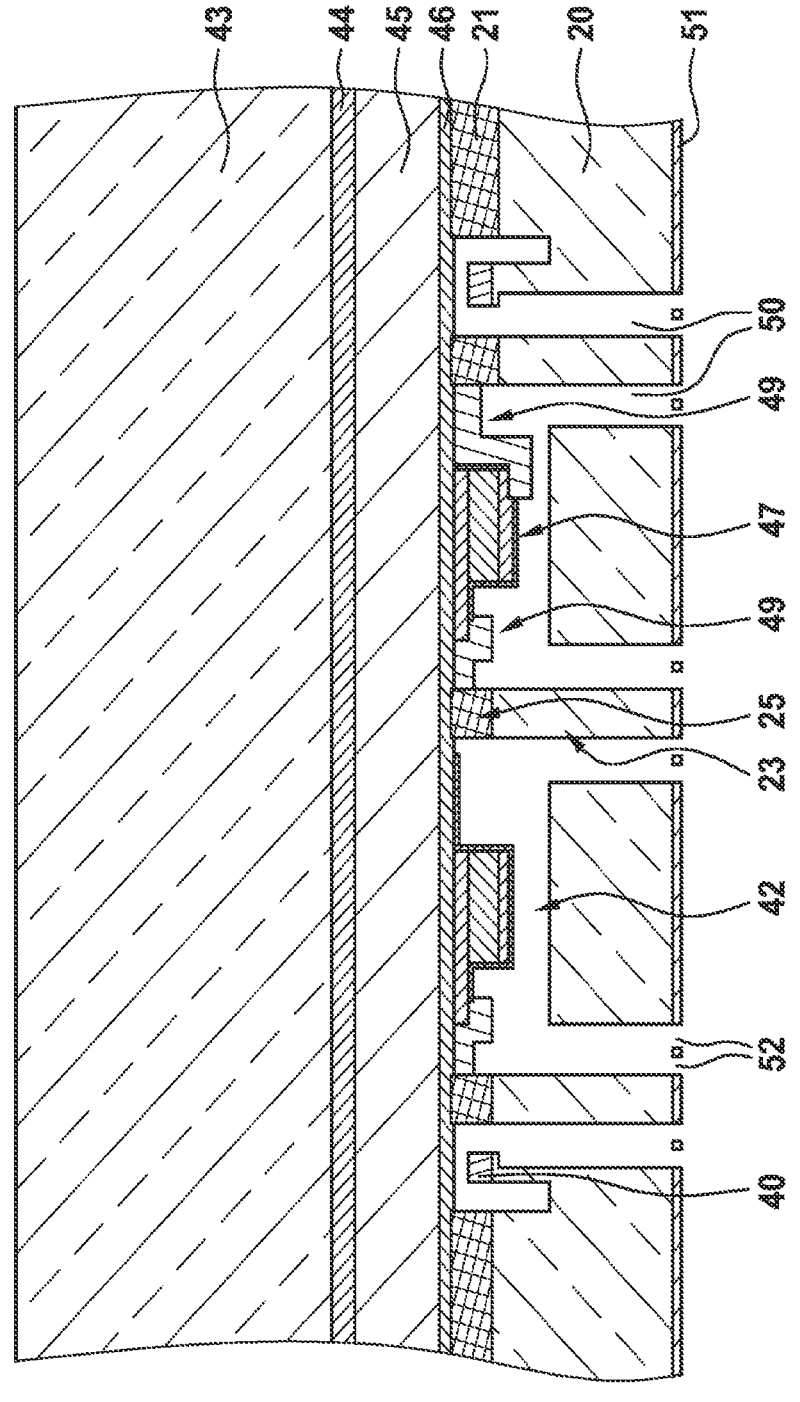

As illustrated in FIG. 14, from the second side (rear side) of the substrate 20, an insulation trench 50 extending around individual bonded connections is trenched into the first substrate so that vias 23 are formed. A very narrow trench that is narrower than 8 micrometers in the opening region is preferably etched for thicknesses of the substrate 20 between 20 and 100 micrometers.

Furthermore, with a trench process having a large lateral over-etching, a continuous and contiguous trench is produced underneath the structured circumferential region.

Figure 15:
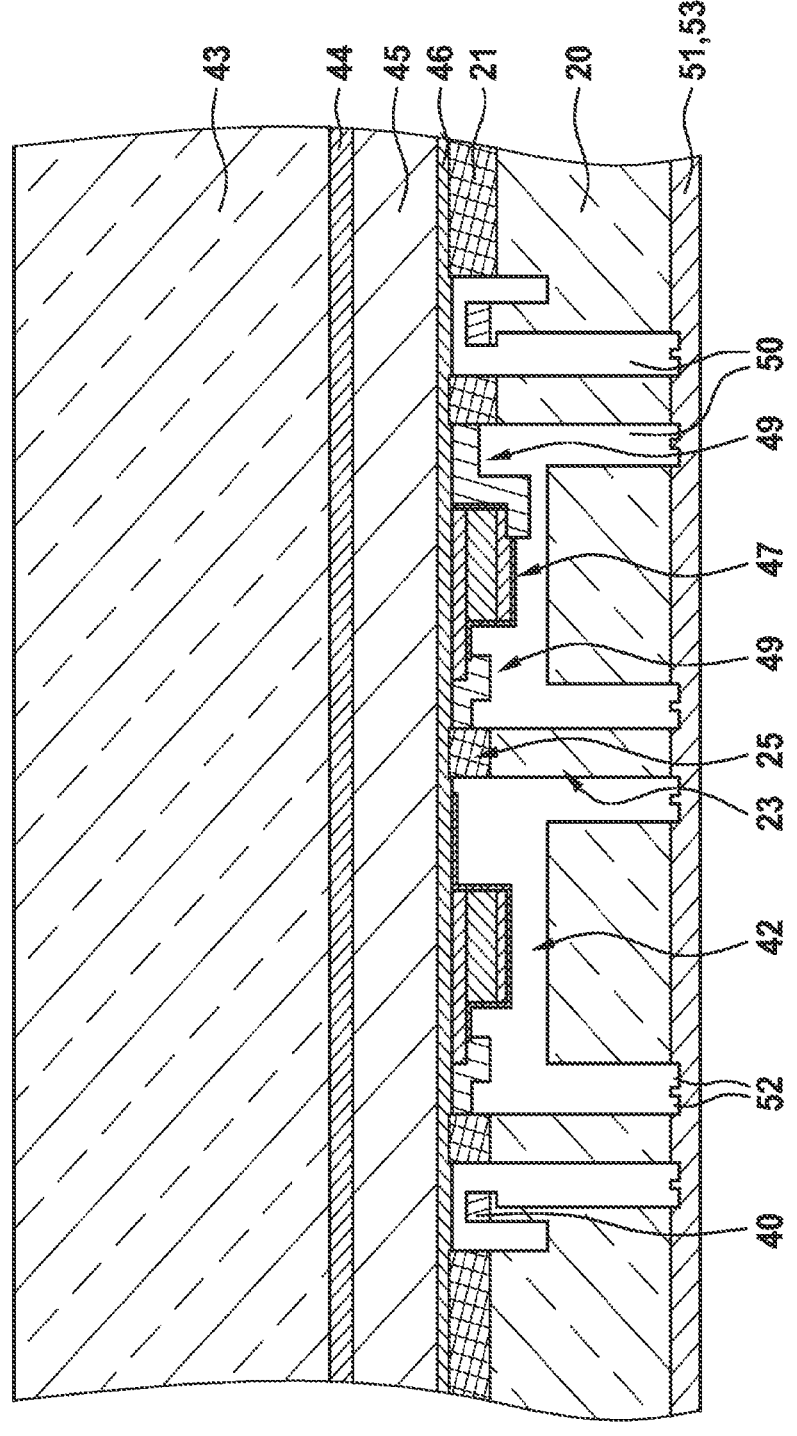

As illustrated in FIG. 15, an insulation layer 53 is applied to the auxiliary layer 51 and structured. The insulation trenches 50 previously created in the first substrate are sealed by this insulation layer 53.

Preferably, the insulation layer 53 is an oxide layer. Preferably, the insulation trenches 50 are sealed only on the rear side, and sealed cavities remain in the substrate 20 itself in the insulation trenches 50.

Figure 16:
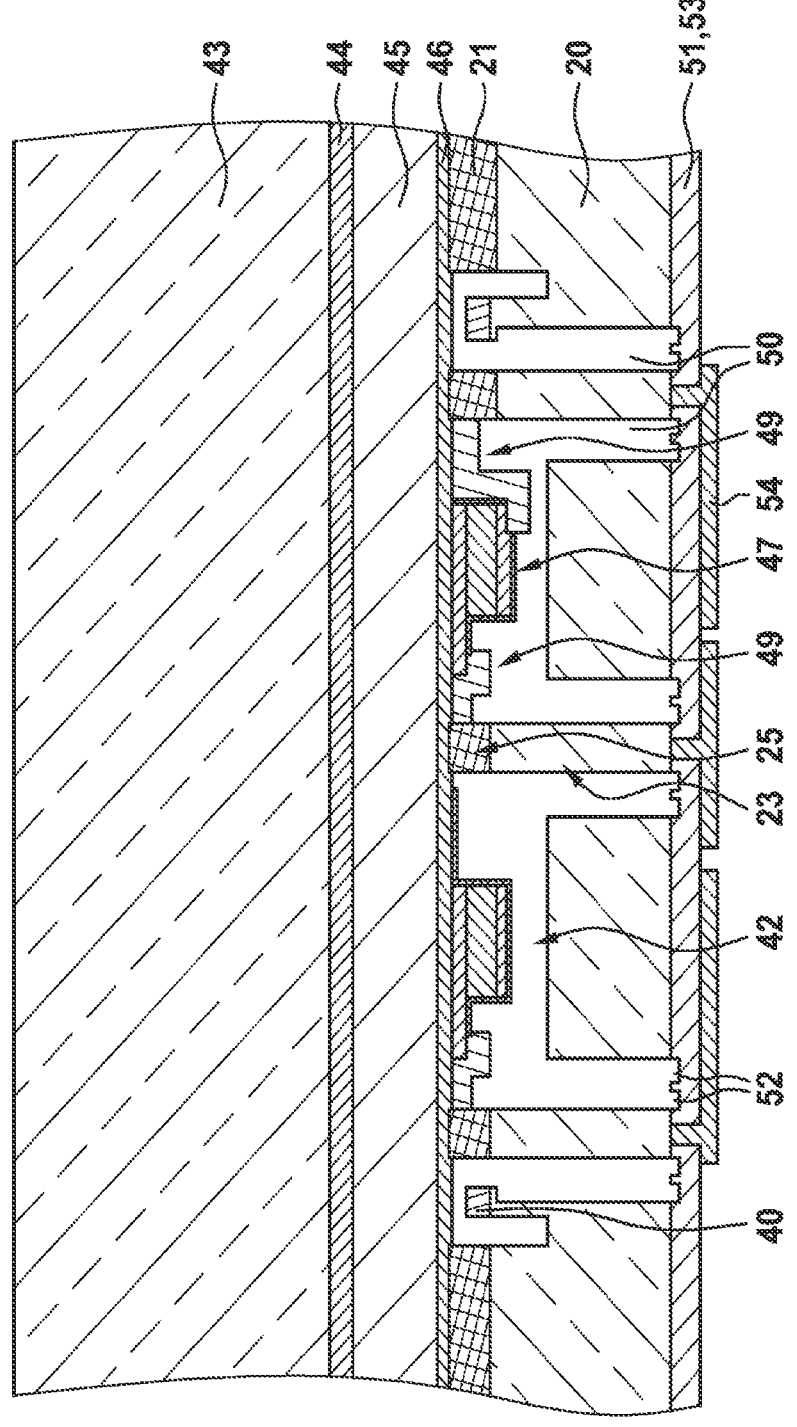

As illustrated in FIG. 16, one or more conductive paths (conducting layers) 54 are optionally deposited and structured.

Figure 17:
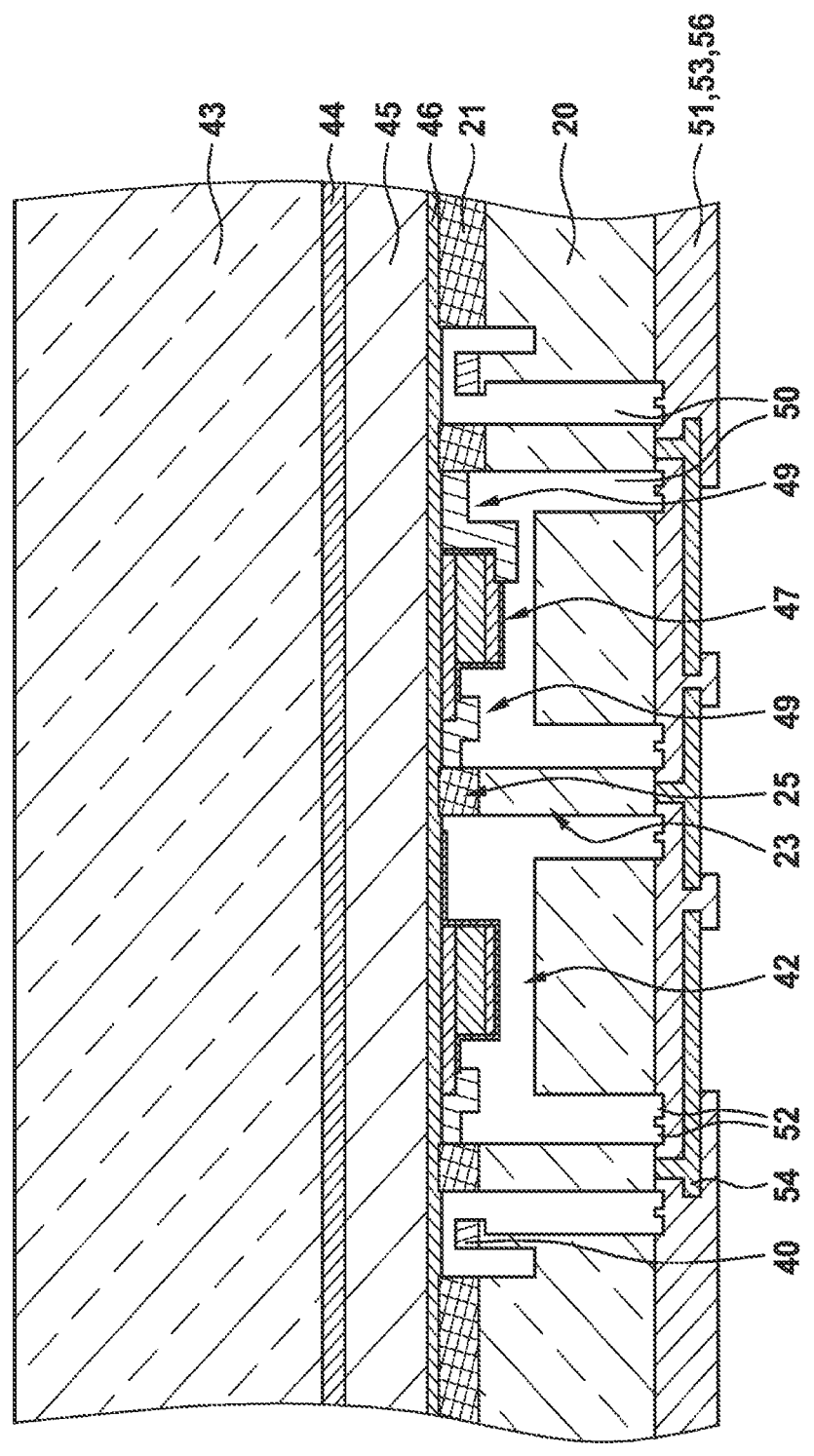

As illustrated in FIG. 17, additional insulation layers 56 may be deposited and structured.

Figure 18:
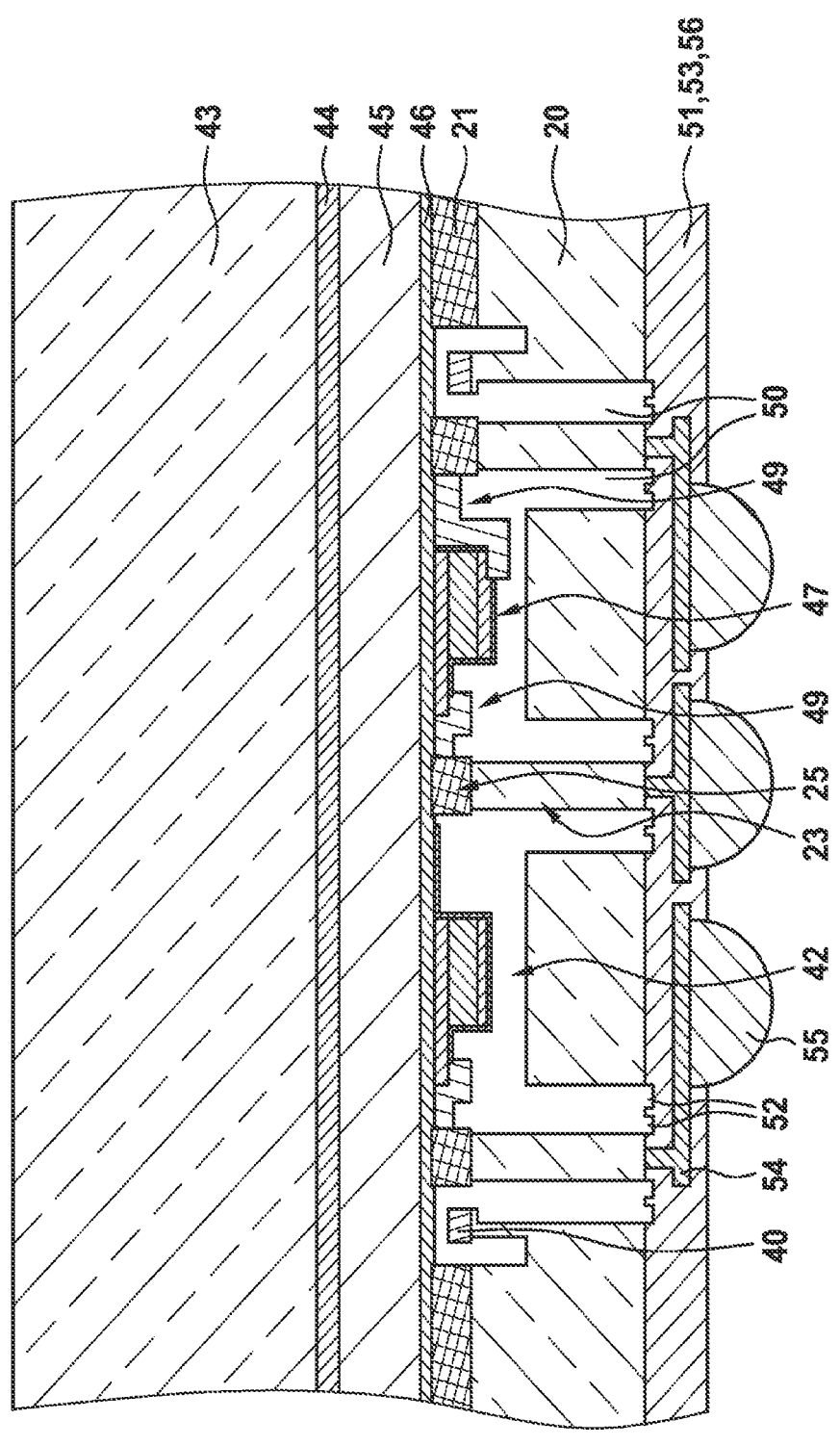

As illustrated in FIG. 18, solder balls 55 or solderable layers or solder bumps are deposited on the conductive paths 54.

The conductive paths 49, the bonding connections 25, the vias 23, the conductive paths 54, and the solder balls 55 form electrical contact connections.

Figure 19:
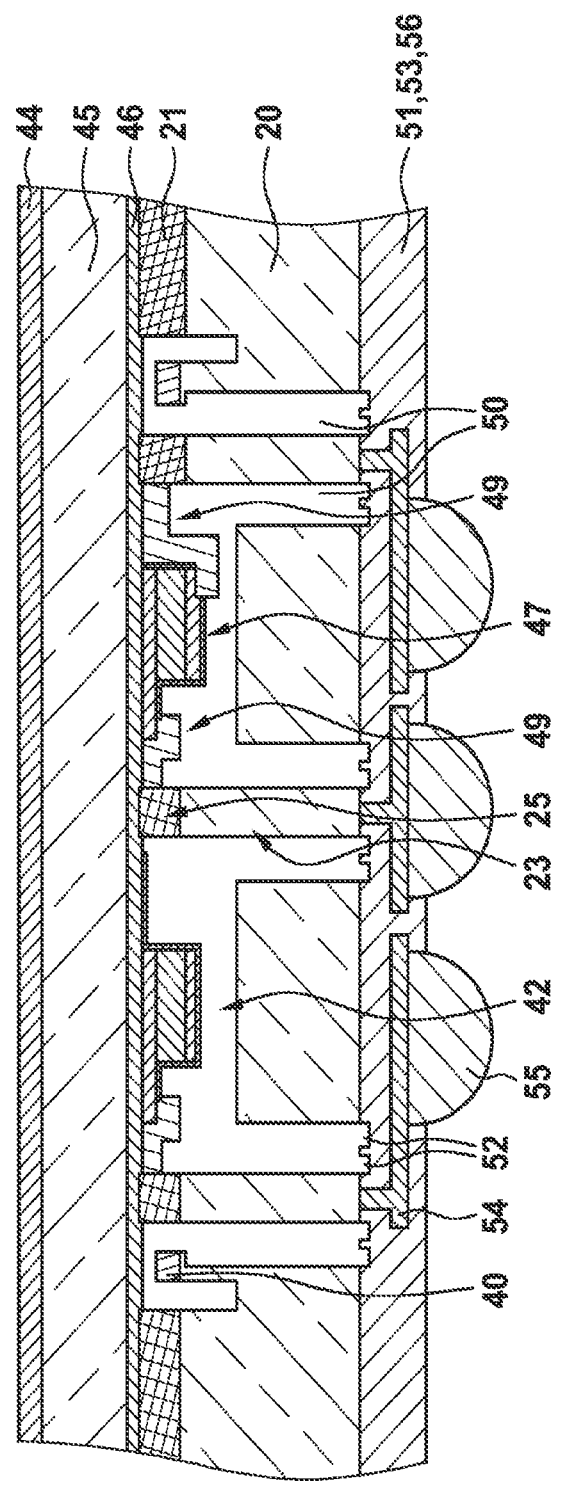

As shown in FIG. 19, the carrier substrate 43 is thinned from a first side (front side).

In a technically particularly simple variant, a mechanical back-thinning takes place first and then a plasma or wet etching process that stops at the etch stop layer 44.

Figure 20:
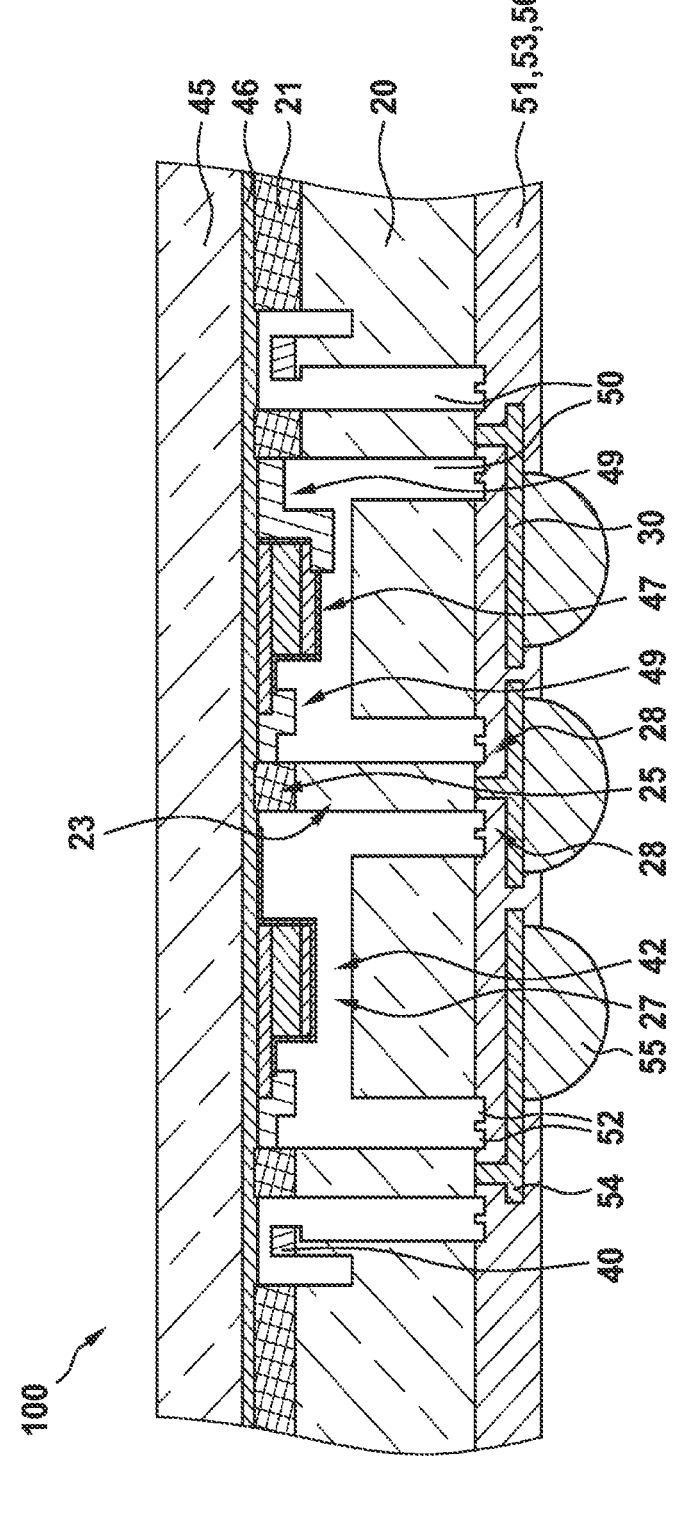
FIG. 20 shows a micromechanical component according to one embodiment of the present invention.

As shown in FIG. 20, the etch stop layer 44 can optionally also be subsequently removed. Thus, a very precisely defined thickness of the diaphragm 45 can be achieved very simply despite high removal.

FIG. 20 shows the micromechanical component 100 in the finished state.

The carrier substrate 43 and the etch stop layer 44 may also be only partially removed and may be structured at least in an edge region, in order to obtain a structure shown in FIG. 4, for example. Thus, only sub-regions are thinned, or regions are thinned differently. As a result, an edge region may be formed in order to achieve better gellability and/or to produce higher mechanical robustness.

From here onward, standard further processing of the micromechanical component 100 can take place. The substrate 20 is separated and the chips are soldered to the control circuit, such as an ASIC, by flip chip methods.

Preferably, the vias 23 (substrate punches) illustrated in FIG. 20 are not used to support the movable diaphragm 45. The cut line is only selected so that the functionality of the contact punches is better illustrated. Preferably, the suspension of the diaphragm 45 substantially takes place by the bond regions 60 illustrated in FIG. 4, which are not insulated from the substrate by insulation trenches. This allows very robust suspensions to be realized. The bond regions 25 with circumferential insulation trenches 50 are preferably arranged in this arrangement outside the active region of the diaphragm 45.

The present invention is not limited to the exemplary embodiments described. Thus, on the first side (front side) of the substrate 20, a further insulation layer may be deposited and structured. This may be provided in particular in the region in which the insulation trenches 50 are located. This insulation layer can thus serve as a trench stop layer in the production of the insulation trenches 50. The etch gas then cannot penetrate into and damage the cavity in which the piezoelectric elements 47 are arranged.

What is claimed is:

1. A micromechanical component for a sound transducer device, comprising:
   a substrate;
   a vibrating diaphragm connected to the substrate;
   at least one piezoelectric element arranged between the diaphragm and the substrate and connected to the diaphragm, wherein the at least one piezoelectric element is configured to produce and/or detect vibrations of the diaphragm in an ultrasonic range; and
   at least one electrical contact connection electrically connected to the at least one piezoelectric element, wherein the micromechanical component is configured to be connected, using flip chip technology, to a control circuit such that the at least one piezoelectric element can be electrically connected to the control circuit using the at least one electrical contact connection;
   wherein the substrate is connected to the diaphragm and/or the at least one piezoelectric element using a bonded connection, wherein a circumferential insulation trench is formed in the substrate around at least one bonded connection.

2. The micromechanical component according to claim 1, wherein the bonded connection includes at least one of aluminum and germanium.

3. The micromechanical component according to claim 1, wherein an electrically insulating material is formed on a surface of the substrate in a region of the insulation trench.

4. The micromechanical component according to claim 1, wherein the at least one electrical contact connection includes at least one of at least one solder ball and a first conductive path on a side of the substrate facing away from the diaphragm.

5. The micromechanical component according to claim 1, wherein at least one of the at least one piezoelectric element is electrically connected to at least one bonded connection using a second conductive path, wherein a material of the second conductive path includes aluminum.

6. The micromechanical component according to claim 1, wherein the at least one piezoelectric element is surrounded by a completely circumferential bond frame, wherein the bond frame connects the substrate to the diaphragm.

7. A sound transducer device, comprising:
   a micromechanical component, including:
      a substrate,
      a vibrating diaphragm connected to the substrate,
      at least one piezoelectric element arranged between the diaphragm and the substrate and connected to the diaphragm, wherein the at least one piezoelectric element is configured to produce and/or detect vibrations of the diaphragm in an ultrasonic range, and
      at least one electrical contact connection electrically connected to the at least one piezoelectric element,
      wherein the substrate is connected to the diaphragm and/or the at least one piezoelectric element using a bonded connection, wherein a circumferential insulation trench is formed in the substrate around at least one bonded connection; and
   a control circuit, wherein the micromechanical component is connected, using flip chip technology, to the control circuit, and wherein the at least one piezoelectric element of the micromechanical component is electrically connected to the control circuit using the at least one electrical contact connection.

8. A method for producing a micromechanical component, comprising the following steps:
   providing a substrate;
   forming a vibrating diaphragm connected to the substrate;
   providing at least one piezoelectric element arranged between the diaphragm and the substrate and connected to the diaphragm, wherein the at least one piezoelectric element is configured to produce and/or detect vibrations of the diaphragm in an ultrasonic range; and
   forming at least one electrical contact connection electrically connected to the at least one piezoelectric element, wherein the micromechanical component is configured to be connected, using flip chip technology, to a control circuit such that the at least one piezoelectric element can be electrically connected to the control circuit using the at least one electrical contact connection;
   wherein the substrate is connected to the diaphragm and/or the at least one piezoelectric element using a bonded connection, wherein a circumferential insulation trench is formed in the substrate around the bonded connection.

9. The method according to claim 8, wherein the forming of the vibrating diaphragm connected to the substrate includes the following steps:
   forming an etch stop layer on a surface of a carrier substrate;
   forming a diaphragm layer on the etch stop layer; and
   at least partially removing the carrier substrate, at least in part using etching methods.

10. The method according to claim 9, wherein the carrier substrate and the etch stop layer are removed only partially and are structured at least in an edge region.

11. The method according to claim 8, wherein the diaphragm is connected to the substrate using the bonded connection.

12. The method according to claim 11, wherein for bonding, a layer including aluminum is used on the diaphragm side, and a layer including germanium is used on the substrate side.

13. The method according to claim 12, wherein an electrically insulating material is formed on a surface of the substrate in a region of the insulation trench.

* * * * *